United States Patent
Suh et al.

(10) Patent No.: US 8,373,184 B2
(45) Date of Patent: Feb. 12, 2013

(54) VERTICAL NITRIDE BASED SEMICONDUCTOR LIGHT EMITTING DEVICE HAVING IMPROVED LIGHT EXTRACTION EFFICIENCY

(75) Inventors: Hyo Won Suh, Chunlanam-do (KR); Jin Young Hong, Seoul (KR)

(73) Assignee: Samsung Electronics Co. Ltd., Gyeonggi-do (KR)

( * ) Notice: Subject to any disclaimer, the term of this patent is extended or adjusted under 35 U.S.C. 154(b) by 1179 days.

(21) Appl. No.: 11/430,982

(22) Filed: May 10, 2006

(65) Prior Publication Data

US 2006/0261323 A1    Nov. 23, 2006

(30) Foreign Application Priority Data

May 19, 2005 (KR) .................. 10 2005-0042091

(51) Int. Cl.
*H01L 29/06* (2006.01)
(52) U.S. Cl. .................. 257/98; 257/13; 257/E33.028; 257/E33.074
(58) Field of Classification Search .................. 257/98, 257/E33.028, E33.074
See application file for complete search history.

(56) References Cited

U.S. PATENT DOCUMENTS

| | | | | |
|---|---|---|---|---|
| 4,977,013 A * | 12/1990 | Ritchie et al. | ............... | 428/212 |
| 5,369,289 A * | 11/1994 | Tamaki et al. | ................ | 257/99 |
| 5,792,698 A * | 8/1998 | Nishitani | ................ | 438/287 |
| 5,798,537 A * | 8/1998 | Nitta | ............... | 257/103 |
| 6,464,762 B1 * | 10/2002 | Arao | ............... | 106/1.22 |
| 6,469,324 B1 * | 10/2002 | Wang | ................ | 257/98 |
| 6,509,651 B1 * | 1/2003 | Matsubara et al. | ............... | 257/461 |
| 6,653,765 B1 * | 11/2003 | Levinson et al. | ............... | 313/112 |
| 7,122,834 B2 * | 10/2006 | Ogihara et al. | ................ | 257/67 |
| 7,190,004 B2 * | 3/2007 | Nagai et al. | ................ | 257/102 |
| 7,342,246 B2 * | 3/2008 | Sugiura et al. | ................ | 257/40 |
| 2001/0005023 A1 * | 6/2001 | Itoh et al. | ................ | 257/103 |
| 2001/0033135 A1 * | 10/2001 | Duggal et al. | ................ | 313/506 |
| 2002/0197764 A1 * | 12/2002 | Uemura et al. | ................ | 438/79 |
| 2003/0020061 A1 * | 1/2003 | Emerson et al. | ................ | 257/14 |
| 2003/0047745 A1 * | 3/2003 | Suzuki et al. | ................ | 257/103 |
| 2003/0183824 A1 * | 10/2003 | Doi et al. | ................ | 257/79 |

(Continued)

FOREIGN PATENT DOCUMENTS

DE    102 34 977 A1    2/2004
JP    57-106246 U    6/1982

(Continued)

OTHER PUBLICATIONS

English machine translation of Korean Patent Document No. 2005-0042091 to "Suh".*

(Continued)

*Primary Examiner* — Hrayr A Sayadian
(74) *Attorney, Agent, or Firm* — McDermott Will & Emery LLP

(57) ABSTRACT

The invention provides a nitride semiconductor light emitting device. In the invention, a first conductivity-type nitride semiconductor layer is formed on a conductive substrate having light transmissibility. An active layer is formed on the first conductivity-type nitride semiconductor layer. Also, a second conductivity-type nitride semiconductor layer is formed on the active layer. Further, a conductive light scattering layer made of a conductive material is formed on an underside of the substrate. The conductive light scattering layer has light transmissibility of 70% or more and has a rough pattern formed on an outer surface to scatter light.

5 Claims, 3 Drawing Sheets

U.S. PATENT DOCUMENTS

| | | | |
|---|---|---|---|
| 2003/0189217 A1* | 10/2003 | Imai | 257/99 |
| 2003/0214807 A1* | 11/2003 | Liu | 362/100 |
| 2004/0056254 A1 | 3/2004 | Bader et al. | |
| 2004/0130015 A1* | 7/2004 | Ogihara et al. | 257/678 |
| 2004/0206969 A1 | 10/2004 | Orita | |
| 2005/0000564 A1* | 1/2005 | Sato et al. | 136/256 |
| 2005/0056831 A1* | 3/2005 | Senda et al. | 257/40 |
| 2005/0093008 A1* | 5/2005 | Suehiro et al. | 257/98 |
| 2005/0253129 A1* | 11/2005 | Tsai et al. | 257/13 |
| 2005/0287687 A1* | 12/2005 | Liao et al. | 438/22 |
| 2006/0013967 A1* | 1/2006 | Mikoshiba et al. | 428/1.1 |
| 2006/0097271 A1* | 5/2006 | Eisert et al. | 257/91 |
| 2006/0145170 A1* | 7/2006 | Cho | 257/95 |
| 2006/0202219 A1* | 9/2006 | Ohashi et al. | 257/98 |
| 2006/0261323 A1* | 11/2006 | Suh et al. | 257/13 |
| 2007/0224714 A1* | 9/2007 | Ikeda et al. | 438/26 |
| 2008/0121918 A1* | 5/2008 | DenBaars et al. | 257/98 |
| 2008/0191191 A1* | 8/2008 | Kim | 257/13 |

FOREIGN PATENT DOCUMENTS

| | | |
|---|---|---|
| JP | 08-102549 | 4/1996 |
| JP | 10-163525 | 6/1998 |
| JP | 11-317546 | 11/1999 |
| JP | 2000-196152 | 7/2000 |
| JP | 2002-368263 A | 12/2002 |
| JP | 2003-532298 | 10/2003 |
| JP | 2004-511080 | 4/2004 |
| JP | 2005-005679 | 1/2005 |
| KR | 2005-0042091 * | 10/2006 |
| WO | WO 01/41225 A2 | 6/2001 |

OTHER PUBLICATIONS

Merriam Webster OnLine definition of "on." No Date.*

Japanese Decision of Rejection, with English Translation, issued in Japanese Patent Application No. 2006-138871, dated Dec. 22, 2009.

Japanese Patent Court Decision, w/ English translation thereof, issued in Japanese Patent Application No. JP 2006-138871 dated Oct. 5, 2010.

* cited by examiner

VERTICAL NITRIDE BASED SEMICONDUCTOR LIGHT EMITTING DEVICE HAVING IMPROVED LIGHT EXTRACTION EFFICIENCY

CLAIM OF PRIORITY

This application claims the benefit of Korean Patent Application No. 2005-42091 filed on May 19, 2005 in the Korean Intellectual Property Office, the disclosure of which is incorporated herein by reference.

BACKGROUND OF THE INVENTION

1. Field of the Invention

The present invention relates to a nitride semiconductor light emitting device, and more particularly, to a vertical nitride semiconductor light emitting device improved in light extraction efficiency.

2. Description of the Related Art

Recently, a nitride semiconductor light emitting device has been spotlighted in related technical fields as a high-power optical device capable of generating light of wide wavelength band including light of short wavelength such as blue or green light. The nitride semiconductor device is made of a semiconductor single crystal having a composition expressed by $Al_xIn_yGa_{(1-x-y)}N$, where $0 \leq x \leq 1$, $0 \leq y \leq 1$ and $0 \leq x+y \leq 1$.

In general, light efficiency of the nitride semiconductor light emitting device is determined by internal quantum efficiency and light extraction efficiency (also called external quantum efficiency). Especially, light extraction efficiency is decided by an optical parameter of the light emitting device, i.e., refractivity of each structure and/or flatness of an interface.

In terms of light extraction efficiency, the nitride semiconductor device bears fundamental limitations. That is, a semiconductor layer of the semiconductor light emitting device has higher refractivity than an external atmosphere or substrate. This reduces a critical angle determining an incidence angle range of light that can be extracted, consequently causing a great portion of light generated from the active layer to suffer total internal reflection and to propagate in an undesired direction. Alternatively, a majority of light is lost during total internal reflection, thus lowering light extraction efficiency.

To overcome problems in light extraction efficiency as described above, Japanese Patent Application Publication No. 2002-368263 (published on Dec. 20, 2002, assigned to Toyota Gosei KK) teaches a flip-chip nitride light emitting device having a roughened underside as shown in FIG. 1a.

Referring to FIG. 1a, the nitride semiconductor light emitting device 10 according to the aforesaid document includes a sapphire substrate 11, a first conductivity-type nitride semiconductor layer 14 formed on the sapphire substrate 11, an active layer 15 formed on the first conductivity-type nitride semiconductor layer 14, and a second conductivity-type nitride semiconductor layer 16 formed on the active layer 15. Also, a buffer layer 12 is formed on the sapphire substrate to enhance crystalinity of the nitride semiconductor layer. The nitride semiconductor light emitting device 10 includes first and second electrodes 19a and 19b connected to the first conductivity-type nitride semiconductor layer 14 and the second conductivity-type nitride semiconductor layer 16, respectively. Further, an underside of the sapphire substrate 11 is roughened via etching to form a light scattering surface.

To manufacture a flip-chip nitride semiconductor light emitting device 20 as in FIG. 1b, the nitride semiconductor light emitting device 10 shown in FIG. 1a is mounted onto a package substrate 21 having first and second conductive lines 22a and 22b. In addition, the electrodes 19a and 19b are connected to the first and second conductive lines 22a and 22b by connecting means S such as soldering. At this time, the underside 11a of the sapphire substrate 11 serves as a light scattering surface where light exits. Light generated from the active layer 15 directly heads toward the light exiting surface 11a (see reference sign a) or is reflected from a bottom surface toward the light exiting surface 11a (see reference sign b). Then light reaching the light exiting surface 11a is scattered on the roughened underside of the sapphire substrate or exits effectively due to a big critical angle resulting from the pattern with microstructural features.

However, typically, to grow a nitride, a sapphire substrate with high hardness is used. Therefore, it is not an easy process to form a roughened surface, i.e., a rough pattern with microstructural features on the sapphire substrate. Also, a difficult process control renders it hard to form a desired rough pattern.

Meanwhile, the aforesaid conventional nitride light emitting device is limited to a planar structure using an insulating sapphire substrate. The conventional technology is hardly applicable to a vertical nitride light emitting device which has recently drawn considerable attention. That is because the vertical nitride light emitting device has an electrode formed on a light extraction surface where a roughened light scattering surface will be formed.

Also, in the vertical nitride light emitting device, a rough pattern needs to be formed directly on a nitride layer or a conductive substrate such as GaN according to the aforesaid conventional technology. However, high hardness similar to that of the sapphire substrate renders it hard to form the rough pattern via typical wet-etching, thus requiring dry-etching such as ICP. However, disadvantageously, this complicates a process and does not ensure a desired rough pattern.

SUMMARY OF THE INVENTION

The present invention has been made to solve the foregoing problems of the prior art and it is therefore an object of the present invention to provide a vertical nitride semiconductor light emitting device improved in light extraction efficiency by forming a conductive layer having light transmissibility and proper refractivity on an underside of the conductive substrate and forming a desired rough pattern on the conductive layer.

According to an aspect of the invention for realizing the object, there is provided a vertical nitride semiconductor light emitting device comprising: a conductive substrate having light transmissibility; a first conductivity-type nitride semiconductor layer formed on the conductive substrate; an active layer formed on the first conductivity-type nitride semiconductor layer; and a second conductivity-type nitride semiconductor layer formed on the active layer, a conductive light scattering layer formed on an underside of the conductive substrate, the conductive light scattering layer made of a conductive material having a light transmissibility of 70% or more and having a rough pattern formed on an outer surface to scatter light.

Preferably, the conductive light scattering layer is made of a material having a light transmissibility of 80% or more, more preferably 90%. Also, the conductive light scattering layer comprises one selected from a group consisting of Indium Tin Oxide, $SnO_2$, $Ga_2O_3$, ZnO, MgO and $In_2O_3$.

Preferably, the rough pattern of the conductive light scattering layer comprises microstructural features which are spaced from each other in the range of about 0.001 μm to 10 μm.

According to a specific embodiment of the invention, the conductive substrate comprises a first conductivity-type material selected from a group consisting of GaN, $Ga_2O_3$, $LiGaO_3$, ZnO or SiC. In this case, preferably, the conductive light scattering layer is made of a material having a refractivity of 1.5 to 2.4 to ensure light extraction efficiency.

Preferably, the conductive light scattering layer is extended to at least partially cover sides of the nitride light emitting device. Also, to prevent an undesired short circuit, an insulating layer is formed between the conductive light scattering layer covering the sides of the device, and the second conductivity-type nitride layer and the active layer.

The vertical nitride semiconductor light emitting device further comprises an electrode formed on the second conductivity-type nitride layer, wherein the electrode includes a reflective metal layer. The reflective metal layer includes, but not limited to at least one selected from a group consisting of Ag, Al, Rh, Ru, Pt, Au, Cu, Pd, Cr, Ni, Co, Ti, In and Mo and alloys thereof.

BRIEF DESCRIPTION OF THE DRAWINGS

The above and other objects, features and other advantages of the present invention will be more clearly understood from the following detailed description taken in conjunction with the accompanying drawings, in which:

FIG. 1b is a vertical cross-sectional view illustrating a flip-chip nitride semiconductor light emitting package having the light emitting device shown in FIG. 1a;

FIG. 2b is a vertical cross-sectional view illustrating a mounting structure of the nitride semiconductor light emitting device shown in FIG. 2a;

DETAILED DESCRIPTION OF THE PREFERRED EMBODIMENT

Preferred embodiments of the present invention will now be described in detail with reference to the accompanying drawings.

Figure 1A:
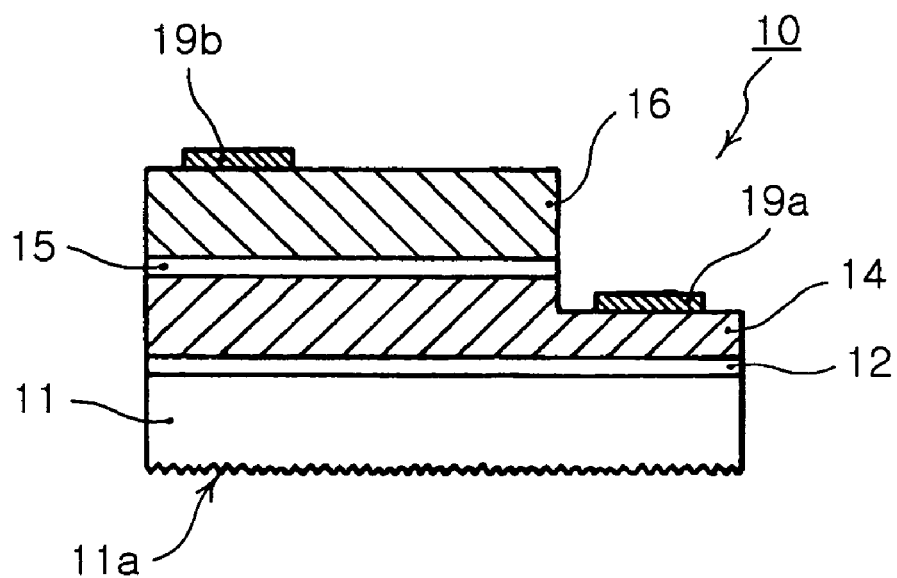
FIG. 1a is a vertical cross-sectional view illustrating a nitride semiconductor light emitting device of the prior art.
Figure 1B:
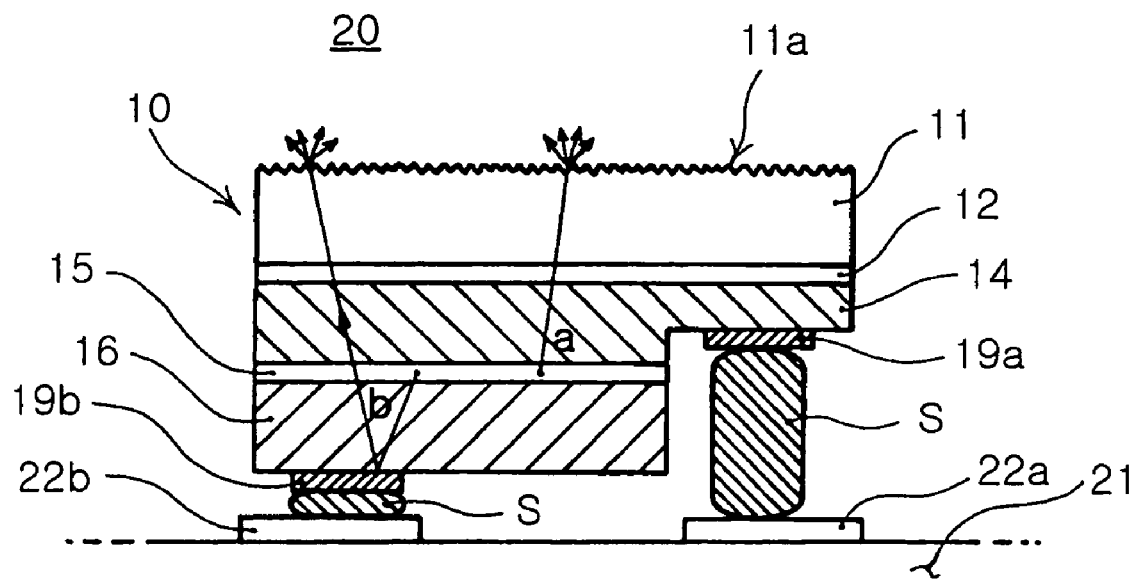
Figure 2A:
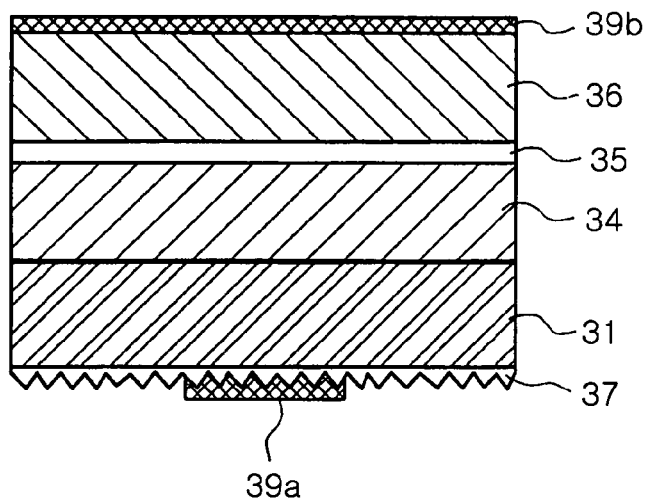
FIG. 2a is a vertical cross-sectional view illustrating a nitride semiconductor light emitting device according to a first embodiment of the invention.
Figure 2B:
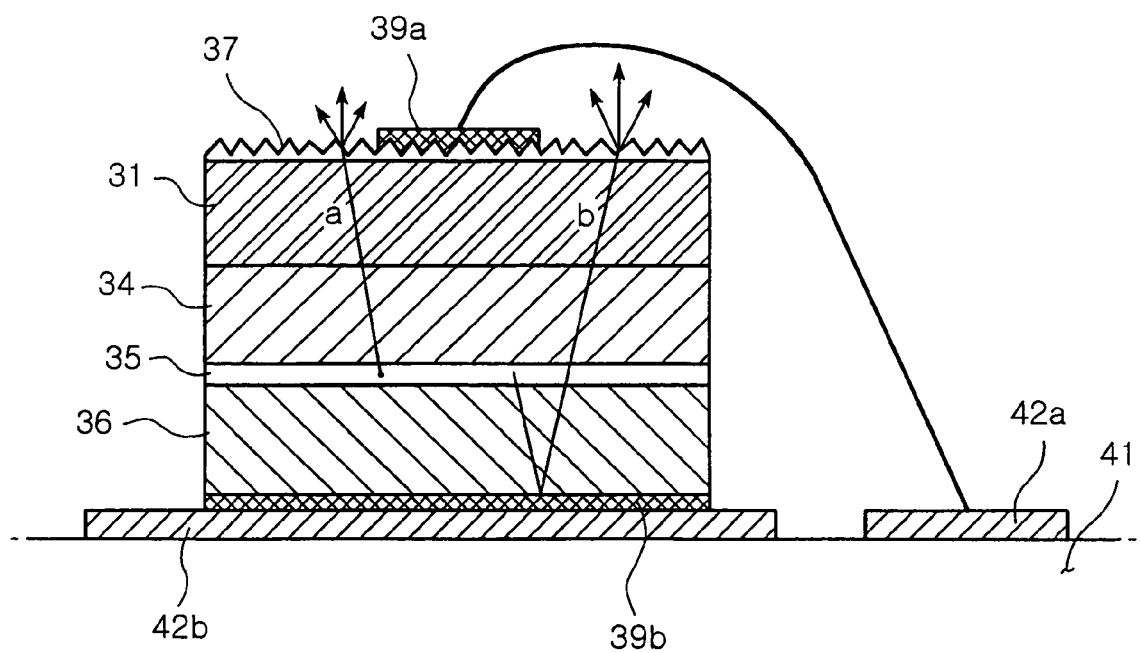

FIG. 2a is a vertical cross-sectional view illustrating a nitride semiconductor light emitting device according to a first embodiment of the invention. FIG. 2b is a vertical cross-sectional view illustrating a mounting structure of the nitride semiconductor light emitting device shown in FIG. 2a.

First, referring to FIG. 2a, a nitride semiconductor light emitting device 30 according to the invention includes a conductive substrate 31, a first conductivity-type nitride semiconductor layer 34, an active layer 35, and a second conductivity-type layer 36 stacked in their order.

In general, the conductive substrate used for a vertical light emitting device may be made of silicon, GaAs, silicon carbide (SiC) and other conductive metal, but the invention requires a highly light transmissible substrate. Preferably, such a substrate is exemplified by a silicon substrate, a GaAs substrate and a GaN substrate. In particular, preferably, GaN, $Ga_2O_3$, $LiGaO_3$, ZnO or SiC is used for the substrate due to no need for a separation process and an additional bonding process after growth of a nitride. The GaN substrate may be a GaN substrate doped with first conductivity-type impurities.

The nitride semiconductor light emitting device 30 includes a first electrode 39a electrically connected to the first conductivity nitride semiconductor layer 34 and a second electrode 39b electrically connected to a second conductivity-type nitride semiconductor layer 36.

In the embodiment, a conductive light scattering layer 37 is formed on a major light extraction surface of the conductive substrate 31. The conductive light scattering layer 37 is made of a conductive material having light transmissibility of 70% or more, preferably 80% or more.

Also, a pattern with microstructural features is formed on an outer surface of the insulating light scattering layer 37 to scatter light. The pattern with microstructural features may be formed via photolithography, chemical etching using a metal mask or physical etching using a plasma gas. The pattern may have microstructure features which are regularly or irregularly formed with various sizes and variously spaced from each other.

However, in emitting light of short wavelength of blue and green, preferably, the pattern has microstructural features uniformly spaced from each other, preferably, in a range of 0.001 to 10 μm.

The conductive light scattering layer 37 is necessarily made of a material having excellent adhesiveness with the conductive substrate 31 and ensuring light transmissibility. The conductive light scattering layer 37 may be formed of a general transparent electrode material. Especially, a material of the light transmissible oxide layer may be employed. The conductive light scattering layer 37 includes but not limited to Indium Tin Oxide (ITO), ZnO, MgO, $In_2O_3$ or mixtures thereof.

Figure 3:
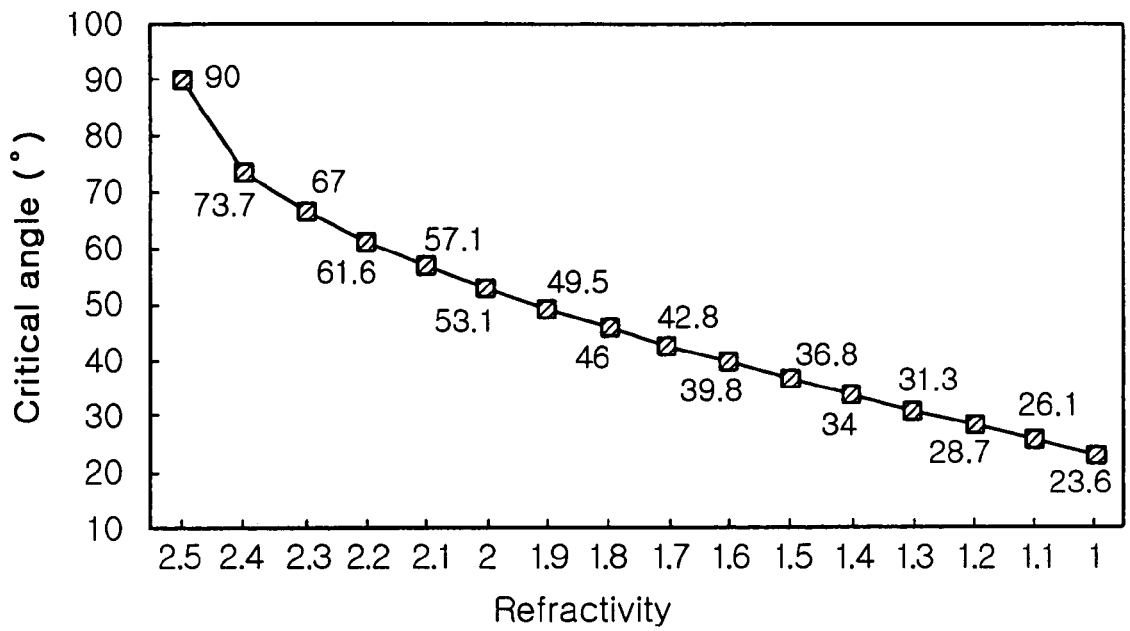
FIG. 3 is a graph illustrating critical angles of light extraction from GaN at GaN/heterogeneous material interfaces, plotted with respect to refractivities of heterogeneous materials.

Preferably, the conductive light scattering layer 37 has reflectivity in consideration of a critical angle of light extraction. As described above, light extraction efficiency is restricted by the critical angle of light extraction arising from a refractivity difference. That is, the refractivity difference with GaN lowers the critical angle of light extraction, causing photons traveling at any angle of incidence greater than the critical angle to undergo total internal reflection, without exiting to the outside. For example, as shown in FIG. 3, when the GaN substrate directly forms an interface with an epoxy resin layer (refractivity of 1.5) in a package, the critical angle of light extraction is 36.8°. Also, when the GaN substrate is in direct contact with the atmosphere, the critical angle of light extraction is 23.6°. Such low critical angles lead to decrease in light extraction efficiency.

Therefore, to drastically improve light extraction efficiency, a conductive light scattering layer has a pattern of microstructural features that allows more photons to travel in an angle range smaller than the critical angle. Moreover, the conductive light scattering layer is made of a material having refractivity higher than that of the external atmosphere or the resin layer. In view of this, the conductive light scattering layer is preferably formed of a material having a refractivity of 1.5 or more. Higher refractivity increases the amount of light extracted from the GaN but too high refractivity also makes it difficult for light to exit outward from the conductive light scattering layer 37. Preferably, the conductive light scattering layer is made of a material having a refractivity of 2.4.

Thus, the nitride semiconductor light emitting device according to the embodiment reduces the amount of light reflected by the conductive light scattering layer 37 having a refractivity of 1.5 to 2.4, thereby significantly improving light extraction efficiency.

The nitride semiconductor light emitting device 30 shown in FIG. 2a has a vertical structure in which a first electrode 39a and a second electrode 39b are formed on opposed faces. The first electrode 39a may be formed on the conductive light scattering layer 37. The second electrode 39b is formed on the second conductivity-type nitride layer 36 (chiefly, a p-type nitride semiconductor layer), and structured as a suitable ohmic contact layer known in the art. Preferably, the second electrode 39b further includes a reflective metal layer. The reflective metal layer is made of one selected from a group consisting of Ag, Al, Rh, Ru, Pt, Au, Cu, Pd, Cr, Ni, Co, Ti, In, Mo and alloys thereof.

FIG. 2b illustrates a mounting structure of the nitride semiconductor light emitting device shown in FIG. 2a.

As shown in FIG. 2b, the nitride semiconductor device 30 is mounted on the submount substrate 41 having the first and second conductive lines 42a and 42b so that the second electrode 39b faces downward. In this case, light exits toward the conductive substrate 31 where the conductive light scattering layer 37 is formed. The conductive light scattering layer 37, as stated earlier, considerably enhances light extraction efficiency, and at the same time the second electrode 39b comprises a reflective metal layer, allowing more light to reflect toward a light extraction direction.

Therefore, light generated from the active layer 35 directly heads toward the light exiting surface (see reference sign a) or is reflected from a bottom surface toward the light exiting surface (see reference sign b). Also, the light reaching the light exiting surface may be scattered in the conductive scattering layer formed on the conductive substrate 31, or exit outward at an angle of incidence smaller than a critical angle owing to the pattern with microstructural features. In the embodiment of the invention, the first electrode 39a serving as a bonding electrode may be omitted, or alternatively be directly connected onto the conductive light scattering layer through wire bonding.

Figure 4:
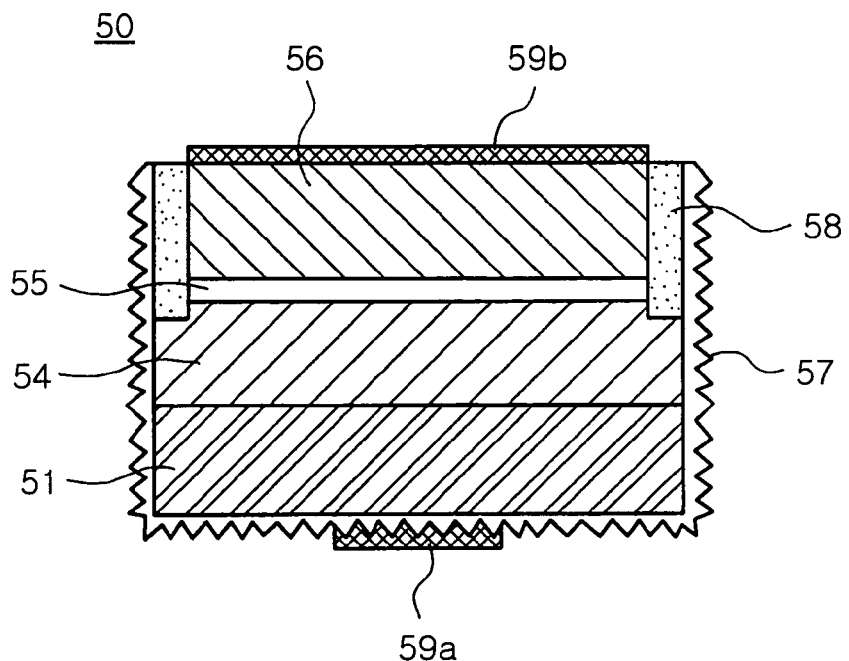
FIG. 4 is a vertical cross-sectional view illustrating a nitride semiconductor light emitting device according to a second embodiment of the invention.

FIG. 4 is a vertical cross-sectional view of a nitride semiconductor light emitting device 50 according to a second embodiment of the invention. The embodiment is characterized in that a conductive light scattering layer 57 is extended to cover sides of the device.

Referring to FIG. 4, the nitride semiconductor device 50 according to this embodiment of the invention, includes a conductive substrate 51, a first conductivity-type nitride semiconductor layer 54, an active layer 55 and a second conductivity-type nitride semiconductor layer 56 stacked in their order. Also, the nitride semiconductor light emitting device 50 includes a first electrode 59a connected to the first conductivity-type nitride semiconductor layer 54 and a second electrode 59b connected to a second conductivity-type nitride semiconductor layer 56.

In this embodiment of the invention, the conductive light scattering layer 57 is extended from the underside of the device 50 to at least partially cover sides of the device. Light chiefly exits through the underside of the conductive substrate 51, but substantially a considerable amount of light is extracted through side of the device 50. Therefore, this embodiment of the invention allows higher light extraction efficiency for the device 50. At this time, if the conductive light scattering layer 57 is extended to cover the sides of the active layer 55 and the second conductivity-type nitride layer 56, an undesired short circuit may arise from the conductive light scattering layer 57. As a result, if the conductive light scattering layer 57 is extended to cover the active layer 55, the active layer 55 and the second conductivity-type nitride layer 56 need to be at least partially etched to form an insulating layer before forming of the conductive light scattering layer 57 to form an insulating layer.

In this embodiment of the invention, to increase light extraction efficiency, the second electrode 59b may additionally include a reflective metal layer (not shown). Preferably, the reflective metal layer is made of a metal having a reflectivity of 90% or more, which is one selected from Ag, Al, Rh, Ru, Pt, Au, Cu, Pd, Cr, Ni, Co, Ti, In, Mo, and alloys thereof.

As set forth above, a vertical nitride semiconductor light emitting device of the invention allows higher light extraction efficiency by forming a conductive light scattering light on an underside of a conductive substrate. The conductive light scattering layer can be advantageously employed in the vertical nitride semiconductor light emitting device due to easy processability and since it does not interrupt terminal connection between upper and lower electrodes.

While the present invention has been shown and described in connection with the preferred embodiments, it will be apparent to those skilled in the art that modifications and variations can be made without departing from the spirit and scope of the invention as defined by the appended claims.

What is claimed is:

1. A vertical nitride semiconductor light emitting device comprising:
   a conductive substrate having first and second opposing sides;
   a first conductivity-type nitride semiconductor layer;
   an active layer disposed on the first conductivity-type nitride semiconductor layer;
   a second conductivity-type nitride semiconductor layer disposed on the active layer;
   a light scattering layer disposed on the first side of the conductive substrate, the light scattering layer being made of a different material from that of the conductive substrate, the material having a light transmissibility of 70% or more and having a rough pattern disposed on an outer surface to scatter light, wherein the light scattering layer has a refractivity of 1.5 to 2.4, and a critical angle of 36.8 to 73.7;
   a first electrode disposed on the light scattering layer having a rough pattern, wherein the light scattering layer and the first electrode are disposed on the same side of the conductive substrate; and
   a second electrode disposed on the second conductivity-type nitride layer, wherein the second electrode is disposed on the second side of the conductive substrate and the second electrode includes a reflective metal layer,
   wherein the light scattering layer extends from the conductive substrate to at least partially cover sides of the nitride light emitting device.

2. The vertical nitride semiconductor light emitting device according to claim 1, wherein the light scattering layer comprises one selected from a group consisting of Indium Tin Oxide, $SnO_2$, $Ga_2O_3$, ZnO, MgO and $In_2O_3$.

3. The vertical nitride semiconductor light emitting device according to claim 1, wherein the rough pattern of the light scattering layer comprises microstructural features which are spaced from each other in the range of about 0.001 μm to 10 μm.

4. The vertical nitride semiconductor light emitting device according to claim 1, further comprising an insulating layer formed between the light scattering layer covering the sides of the device, and the second conductivity-type nitride layer and the active layer.

5. The vertical nitride semiconductor light emitting device according to claim 1, wherein the reflective metal layer comprises at least one selected from a group consisting of Ag, Al, Rh, Ru, Pt, Au, Cu, Pd, Cr, Ni, Co, Ti, In and Mo and alloys thereof.

* * * * *